United States Patent
Tanaka et al.

(10) Patent No.: US 10,331,816 B2
(45) Date of Patent: Jun. 25, 2019

(54) MAGNETIC BODY SIMULATION DEVICE, MICRO-MAGNETIZATION CALCULATION METHOD, AND NON-TRANSITORY COMPUTER-READABLE RECORDING MEDIUM HAVING STORED THEREIN A PROGRAM

(71) Applicant: FUJITSU LIMITED, Kawasaki-shi, Kanagawa (JP)

(72) Inventors: Tomohiro Tanaka, Kawasaki (JP); Koichi Shimizu, Inagi (JP)

(73) Assignee: FUJITSU LIMITED, Kawasaki (JP)

( * ) Notice: Subject to any disclaimer, the term of this patent is extended or adjusted under 35 U.S.C. 154(b) by 288 days.

(21) Appl. No.: 15/298,623

(22) Filed: Oct. 20, 2016

(65) Prior Publication Data

US 2017/0116358 A1 Apr. 27, 2017

(30) Foreign Application Priority Data

Oct. 27, 2015 (JP) .................................. 2015-211328

(51) Int. Cl.
*G06F 17/50* (2006.01)
*G01R 33/00* (2006.01)
(Continued)

(52) U.S. Cl.
CPC ..... *G06F 17/5009* (2013.01); *G01R 33/0064* (2013.01); *G01R 33/10* (2013.01); *G06F 17/17* (2013.01)

(58) Field of Classification Search
CPC .. G06F 17/5018; G06F 17/17; G06F 2217/16; G06F 17/5009; G01R 33/10
(Continued)

(56) References Cited

U.S. PATENT DOCUMENTS

2006/0015306 A1 1/2006 Chow
2012/0029849 A1 2/2012 Shimizu
(Continued)

FOREIGN PATENT DOCUMENTS

JP 2006-53908 2/2006
JP 2012-33116 2/2012
(Continued)

OTHER PUBLICATIONS

Ataka, Tadashi, et al. "Accelerating algorithm of micromagnetic simulation by interpolating magnetization vectors." Magnetics Conference (INTERMAG), 2015 IEEE. IEEE, 2015. pp. 1 (Year: 2015).*

Zakharov, V. A., et al. "Calculations of magnetic fields in ferromagnetic cylindrical rods with allowance for noncollinearity of magnetization vectors." Russian physics journal 48.2 (2005). pp. 175-183. (Year: 2005).*

(Continued)

*Primary Examiner* — Kamini S Shah
*Assistant Examiner* — John E Johansen
(74) *Attorney, Agent, or Firm* — Staas & Halsey LLP

(57) ABSTRACT

A magnetic body simulation device includes a memory; and a processor coupled to the memory and the processor configured to decide a search section for searching a rotational coefficient of each magnetization vector in a plurality of elements included in a magnetic body, in a process of calculating the each rotational coefficient in a state in which magnetic energy of the magnetic body is minimized, to determine whether or not a first condition is satisfied in which a width of the decided search section is less than or equal to a certain length, and a first rotational coefficient decided by a predetermined method is included in the search section, and to calculate, when the first condition is satisfied, a static magnetic field vector corresponding to the first (Continued)

rotational coefficient by linear interpolation based on static magnetic field vectors at both ends of the search section.

15 Claims, 8 Drawing Sheets

(51) Int. Cl.
G01R 33/10 (2006.01)
G06F 17/17 (2006.01)

(58) Field of Classification Search
USPC .......................................................... 703/2
See application file for complete search history.

(56) References Cited

U.S. PATENT DOCUMENTS

2013/0166229 A1 6/2013 Shimizu
2015/0168502 A1 6/2015 Furuya
2016/0370481 A1* 12/2016 Hu .......................... G01V 1/282

FOREIGN PATENT DOCUMENTS

JP 2013-131072 7/2013
WO WO 2014/033888 A1 3/2014

OTHER PUBLICATIONS

Landau, L. A. L. E., and Evgeny Lifshitz. "On the theory of the dispersion of magnetic permeability in ferromagnetic bodies." Phys. Z. Sowjetunion 8.153 (1935). Reprinted 2008. pp. 14-22. (Year: 2008).*
Braun, Thomas R., and Ralph C. Smith. "Efficient inverse compensation for hysteresis via homogenized energy models." Behavior and Mechanics of Multifunctional and Composite Materials 2007. vol. 6526. International Society for Optics and Photonics, 2007. pp. 1-12. (Year: 2007).*
Goldenits, P., et al. "An effective integrator for the Landau-Lifshitz-Gilbert equation." Proceedings of Mathmod 2012 Conference. 2012. pp. 1-7. (Year: 2012).*
Goldfarb, Donald, Zaiwen Wen, and Wotao Yin. "A curvilinear search method for p-harmonic flows on spheres." SIAM Journal on Imaging Sciences 2.1 (2009). pp. 84-109. (Year: 2009).*

* cited by examiner

|  | COERCIVE FORCE [A/m] | NUMBER OF TIMES OF PERFORMING CALCULATION OF STATIC MAGNETIC FIELD POTENTIAL | CALCULATION TIME [sec] |
|---|---|---|---|
| NOT USING THIS EMBODIMENT | $4.11 * 10^6$ | 3375 | 1647 |
| THIS EMBODIMENT | $4.11 * 10^6$ | 1875 | 997 |

MAGNETIC BODY SIMULATION DEVICE, MICRO-MAGNETIZATION CALCULATION METHOD, AND NON-TRANSITORY COMPUTER-READABLE RECORDING MEDIUM HAVING STORED THEREIN A PROGRAM

CROSS-REFERENCE TO RELATED APPLICATION

This application is based upon and claims the benefit of priority of the prior Japanese Patent Application No. 2015-211328, filed on Oct. 27, 2015, the entire contents of which are incorporated herein by reference.

FIELD

The embodiment discussed herein is related to a simulation technology of a magnetic body.

BACKGROUND

A micro-magnetic simulation is a method used in theoretical calculation of a magnetic body or a magnetic material. In the micro-magnetic simulation, for example, as illustrated in FIG. 1, a magnetic body 1m is divided into minute elements. An arrow indicates micro-magnetization. The micro-magnetization is disposed in each element, and the state of micro-magnetization of each element is calculated.

In the micro-magnetic simulation, magnetic energy $E_{total}$ which is the total energy in a system is denoted by the following expression 1.

$$E_{total} = E_{ani} + E_{exc} + E_{appl} + E_{static} \tag{1}$$

Here, $E_{ani}$ is anisotropic energy, $E_{exc}$ is exchange energy, $E_{appl}$ is Zeeman energy, and $E_{static}$ is magnetostatic energy. Furthermore, in order to limit the format, herein, bold face and italic face are not used. The energies are respectively denoted by the following expressions.

$$E_{ani} = \int dV\, K_u(1 - (k \cdot m)^2) \tag{2}$$

$$E_{exc} = \int dV\, A\{(\nabla m_X)^2 + (\nabla m_y)^2 + (\nabla m_Z)^2\} \tag{3}$$

$$E_{appl} = -\int dV\, M_s H_{appl} \cdot m \tag{4}$$

$$E_{static} = \frac{1}{2}\int dV\, M_s H_{static} \cdot m \tag{5}$$

$$H_{static} = -\nabla \phi \tag{6}$$

Here, m is a magnetization vector, $m_x$ is an X component of the magnetization vector, $m_y$ is a Y component of the magnetization vector, $m_z$ is a Z component of the magnetization vector, k is a magnetic anisotropic vector, $K_u$ is a magnetic anisotropic constant, A is an exchange coupling constant, $M_s$ is saturation magnetization, $H_{appl}$ is an external magnetic field vector, $\varphi$ is a static magnetic field potential, and $H_{static}$ is a static magnetic field vector.

Then, the static magnetic field potential $\phi$ is obtained from the following relational expression.

$$\Delta\phi = -\nabla m \tag{7}$$

Among the variables described above, variables which are planned to be set in advance at the time of initiating the calculation are m, k, $K_u$, A, $M_s$, and $H_{appl}$.

In a case where the energies described above are calculated by using a finite element method, a time desired for obtaining the static magnetic field potential $\phi$ occupies the majority of a calculation time. This is because in a case where Expression (7) is numerically dissolved, calculation of dissolving a linear simultaneous equation is performed, and thus, a calculation amount considerably increases.

In analysis of the magnetic body, a steady state frequently gives important information relevant to magnetic physical properties. The steady state of the magnetic body is able to be considered as a state in which total energy in the system described above is minimized. Accordingly, when a micro-magnetization state minimizing the total energy in the system is obtained, the steady state of the magnetic body is able to be reproduced. A method of obtaining the micro-magnetization state for minimizing the total energy of the magnetic body is referred to as an energy minimization method.

Inputs to a micro-magnetic simulation program using the energy minimization method (that is, data that a user prepares in advance) is the model of the magnetic body divided into elements, an initial state of the magnetization vector of each element, and the external magnetic field vector. Output from the micro-magnetic simulation program is the state of the magnetization vector of each element which minimizes the magnetic energy.

International Publication Pamphlet No. WO2014/033888, Japanese Laid-open Patent Publication No. 2012-33116, Japanese Laid-open Patent Publication No. 2013-131072, and Japanese Laid-open Patent Publication No. 2006-53908 are examples of related art.

SUMMARY

According to an aspect of the invention, a magnetic body simulation device includes a memory; and a processor coupled to the memory and the processor configured to decide a search section for searching a rotational coefficient of each magnetization vector in a plurality of elements included in a magnetic body, in a process of calculating the each rotational coefficient in a state in which magnetic energy of the magnetic body is minimized, to determine whether or not a first condition is satisfied in which a width of the decided search section is less than or equal to a certain length, and a first rotational coefficient decided by a predetermined method is included in the search section, and to calculate, when the first condition is satisfied, a static magnetic field vector corresponding to the first rotational coefficient by linear interpolation based on static magnetic field vectors at both ends of the search section.

According to another aspect of the invention, a micro-magnetization calculation method includes deciding, by a processor, a search section for searching a rotational coefficient of each magnetization vector in a plurality of elements included in a magnetic body, in a process of calculating the each rotational coefficient in a state in which magnetic energy of the magnetic body is minimized; determining whether or not a first condition is satisfied in which a width of the decided search section is less than or equal to a certain length, and a first rotational coefficient decided by a predetermined method is included in the search section; and calculating, when the first condition is satisfied, a static magnetic field vector corresponding to the first rotational coefficient by linear interpolation based on static magnetic field vectors at both ends of the search section.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

A nonlinear conjugate gradient (NCG) method which is one type of energy minimization methods is frequently used in the micro-magnetic simulation. The calculation of the static magnetic field potential $\phi$ which is performed in line search occupies the majority of the calculation time of the micro-magnetic simulation of the NCG method. Accordingly, in a case where the calculation amount of the calculation of the static magnetic field potential $\phi$ is able to be reduced, the calculation time of the micro-magnetic simulation is able to be shortened.

In one aspect, an object of the embodiment is to provide a technology for reducing a calculation amount of a micro-magnetic simulation using an NCG method.

Figure 1:
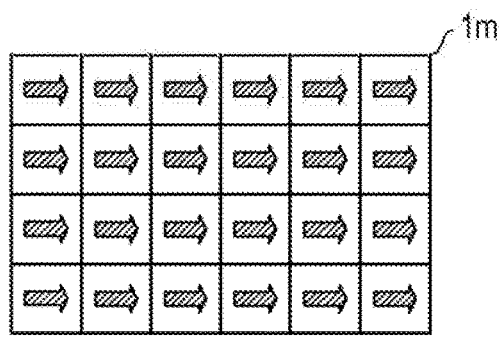
FIG. 1 is a diagram illustrating a magnetic body which is divided into a plurality of elements.
Figure 2:
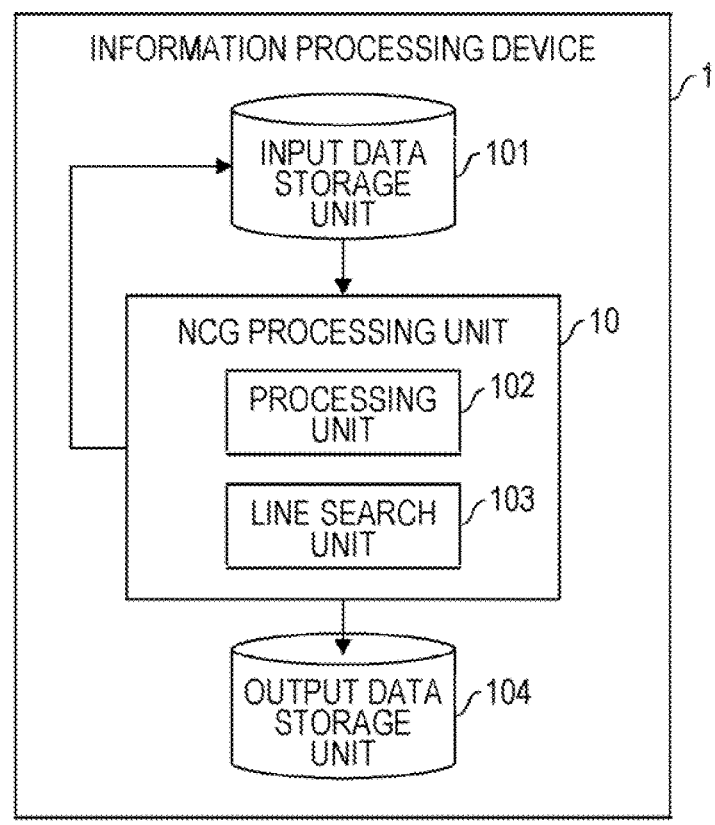
FIG. 2 is a functional block diagram of an information processing device.

FIG. 2 illustrates a functional block diagram of an information processing device 1 of this embodiment. The information processing device 1 includes an input data storage unit 101, an NCG processing unit 10, and an output data storage unit 104. The NCG processing unit 10 includes a line search unit 103 and a processing unit 102 which is, for example, a processor.

The NCG processing unit 10 executes a process based on data stored in the input data storage unit 101, updates the data stored in the input data storage unit 101 based on a processing result, or stores the processing result in the output data storage unit 104. Specifically, the processing unit 102 executes processes other than line search among processes of the NCG method. The line search unit 103 executes line search among the processes of the NCG method.

A model of a magnetic body which is divided into a plurality of elements, data of an initial state of a magnetization vector of each element, and data of an external magnetic field vector are initially stored in the input data storage unit 101. Data of a state of the magnetization vector of each element which minimizes magnetic energy is stored in the output data storage unit 104. Furthermore, the vector of this embodiment is a three-dimensional vector.

Figure 3:
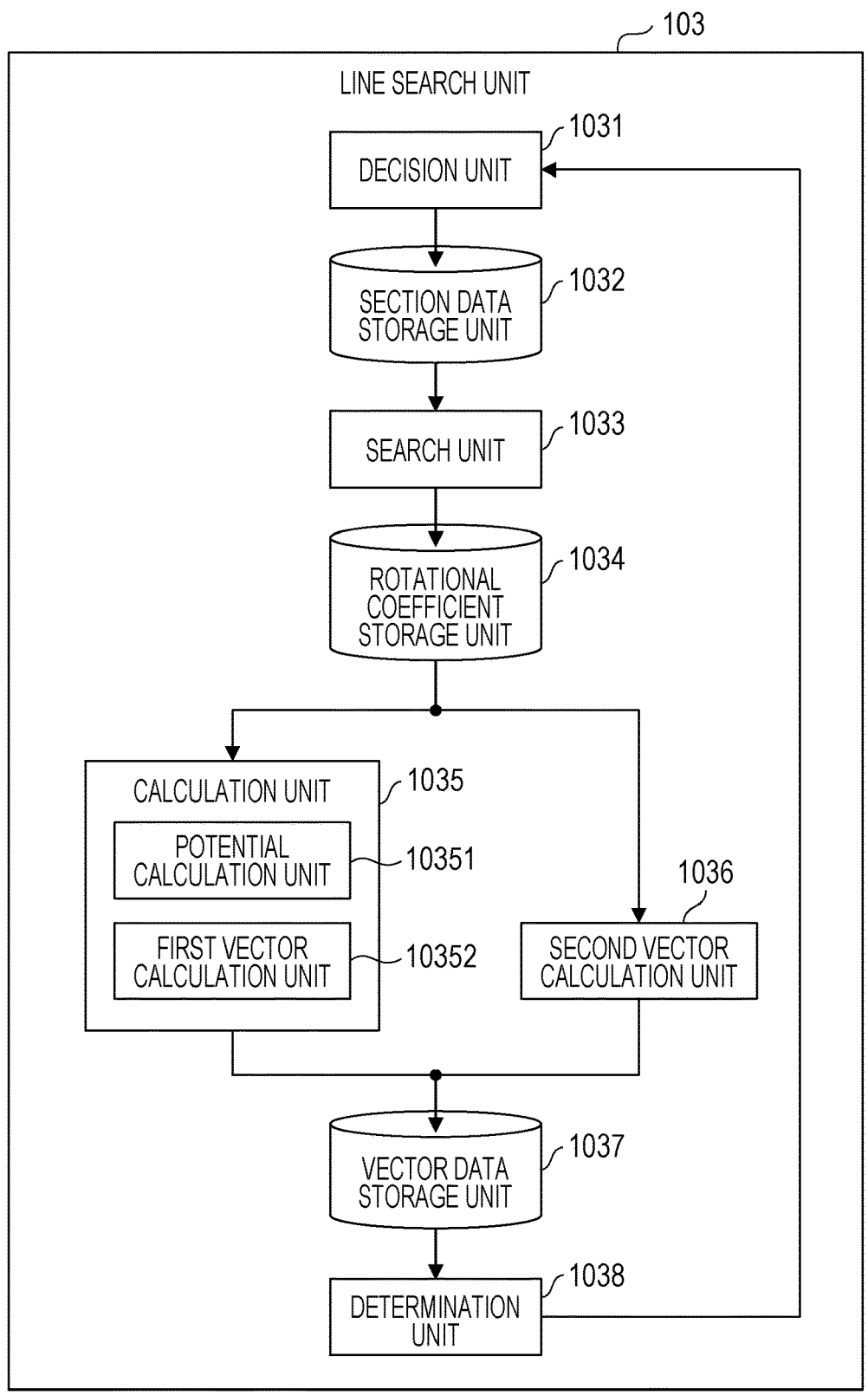
FIG. 3 is a functional block diagram of a line search unit.

FIG. 3 illustrates a functional block diagram of the line search unit 103. The line search unit 103 includes a decision unit 1031, a section data storage unit 1032, a search unit 1033, a rotational coefficient storage unit 1034, a calculation unit 1035, a second vector calculation unit 1036, a vector data storage unit 1037, and a determination unit 1038. The calculation unit 1035 includes a potential calculation unit 10351 and a first vector calculation unit 10352.

The decision unit 1031 executes a process based on the data stored in the input data storage unit 101, and stores a processing result in the section data storage unit 1032. The search unit 1033 executes a process based on the data stored in the section data storage unit 1032 and the data stored in the input data storage unit 101, and stores a processing result in the rotational coefficient storage unit 1034. The potential calculation unit 10351 executes a process based on the data stored in the rotational coefficient storage unit 1034 and the data stored in the input data storage unit 101, and notifies a processing result to the first vector calculation unit 10352. The first vector calculation unit 10352 executes a process based on the result of the process of the potential calculation unit 10351 and the data stored in the input data storage unit 101, and stores a processing result in the vector data storage unit 1037. The second vector calculation unit 1036 executes a process based on the data stored in the rotational coefficient storage unit 1034 and the data stored in the input data storage unit 101, and stores a processing result in the vector data storage unit 1037. The determination unit 1038 executes a process based on the data stored in the vector data storage unit 1037, and updates the data stored in the input data storage unit 101 based on a processing result, or stores the processing result in the output data storage unit 104.

Next, the operation of the information processing device 1 will be described by using FIG. 4 to FIG. 12.

Figure 4:
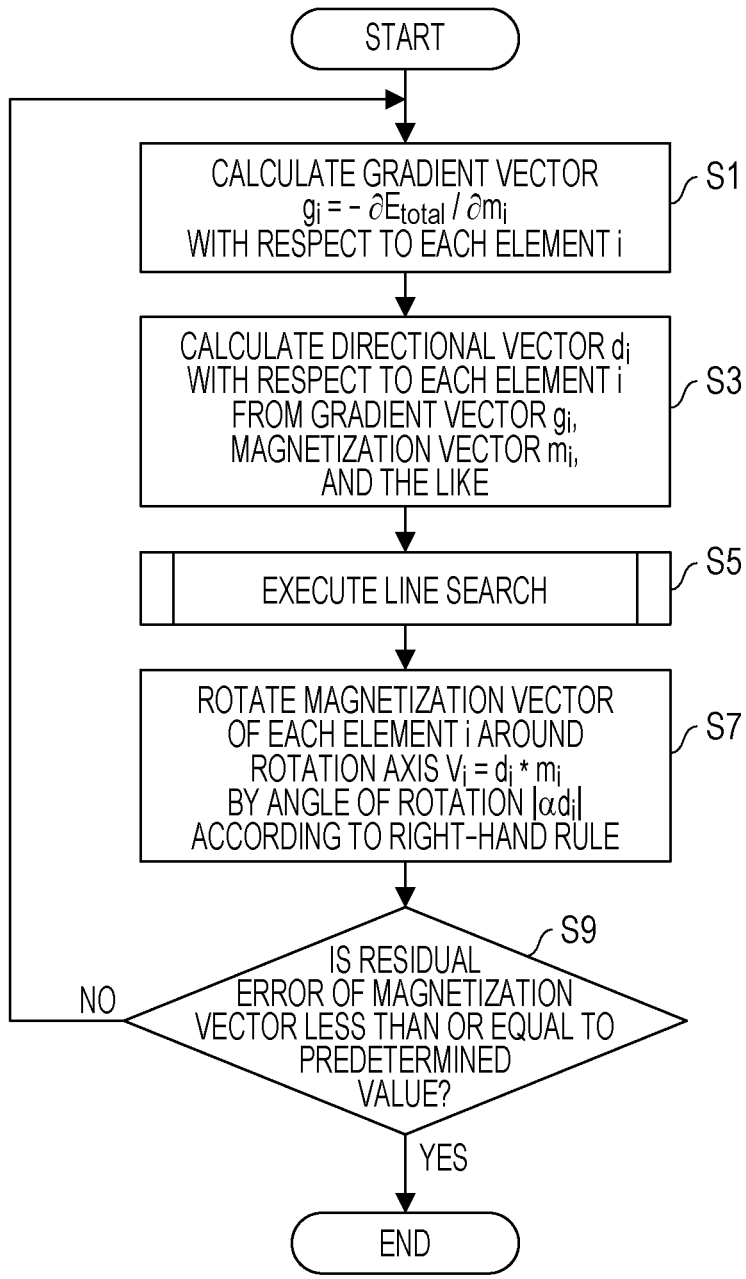
FIG. 4 is a diagram illustrating a main processing flow.

First, the processing unit 102 calculates, by using Expressions (1) to (6), a gradient vector $g_i = -\partial E_{total}/\partial m_i$ with respect to each element i of the magnetic body as a target of the micro-magnetic simulation (FIG. 4: Step S1). In the calculation, there are used the data of the magnetization vector of each element and other data items such as data of k, $K_u$, A, $M_s$, and $H_{appl}$ which are stored in the input data storage unit 101.

The processing unit 102 calculates a directional vector $d_i$ with respect to each element i by using the gradient vector $g_i$, the magnetization vector $m_i$, and the like which are calculated in Step S1 (Step S3). This process is a well known process as an NCG process, and thus the details thereof will not be described.

Then, the line search unit 103 executes the line search (Step S5). The line search will be described by using FIG. 5 to FIG. 9.

Figure 5:
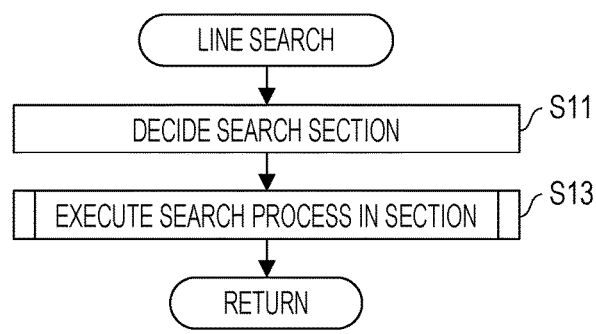
FIG. 5 is a diagram illustrating a processing flow of a line search process.
Figure 6:
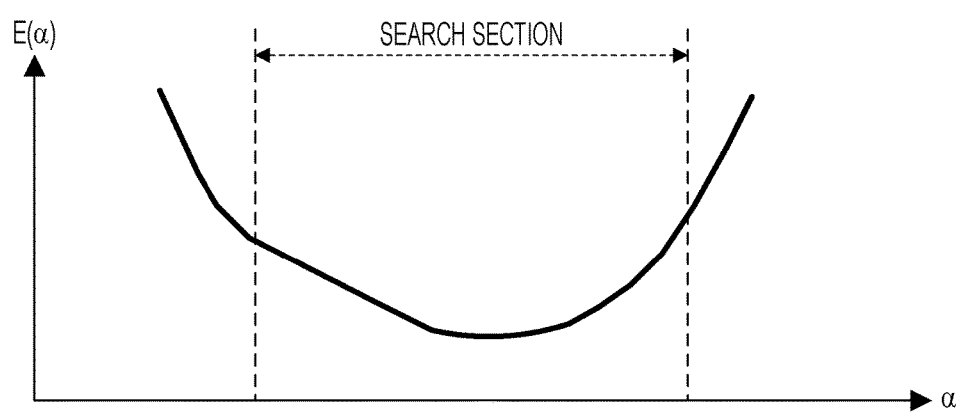
FIG. 6 is a diagram illustrating an outline of decision of a search section.

First, the decision unit 1031 of the line search unit 103 decides a search section including a magnetization vector rotational coefficient $\alpha$ which minimizes magnetic energy $E_{total}$ based on the data stored in the input data storage unit 101 (FIG. 5: Step S11). The search section is defined by the upper limit and the lower limit of $\alpha$. The decision unit 1031 stores information of the decided search section in the section data storage unit 1032. the outline of determining the search section is illustrated in FIG. 6. In FIG. 6, a vertical axis indicates $E_{total}(\alpha)$, and a horizontal axis indicates $\alpha$. In Step S11, for example, first, an initial search section is suitably decided, and a process of widening the search section is executed until the sign of a differential coefficient of a start point of the search section is not coincident with the sign of a differential coefficient of an end point of the search section. In this case, a difference between the signs of the differential coefficients of both ends is a sufficient condition for an extremal value to be in the search section.

Then, the line search unit 103 executes a search process in the section (Step S13). The search process in the section will be described by using FIG. 7 to FIG. 9.

Figure 8:
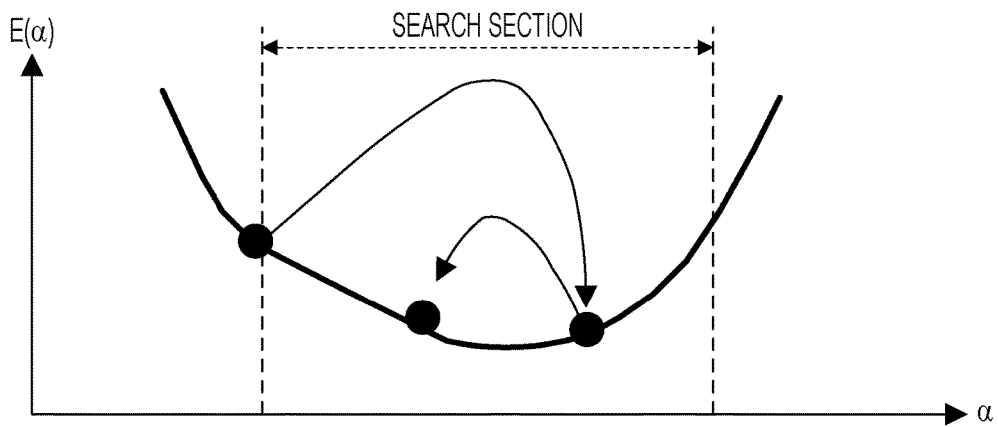
FIG. 8 is a diagram illustrating an outline of the search process in the section.

The outline of the search process in the section is illustrated in FIG. 8. In FIG. 8, a vertical axis indicates $E_{total}(\alpha)$, and a horizontal axis indicates $\alpha$. The search process in the section is a process of searching the magnetization vector rotational coefficient $\alpha$ which minimizes the magnetic energy $E_{total}(\alpha)$.

Figure 7:
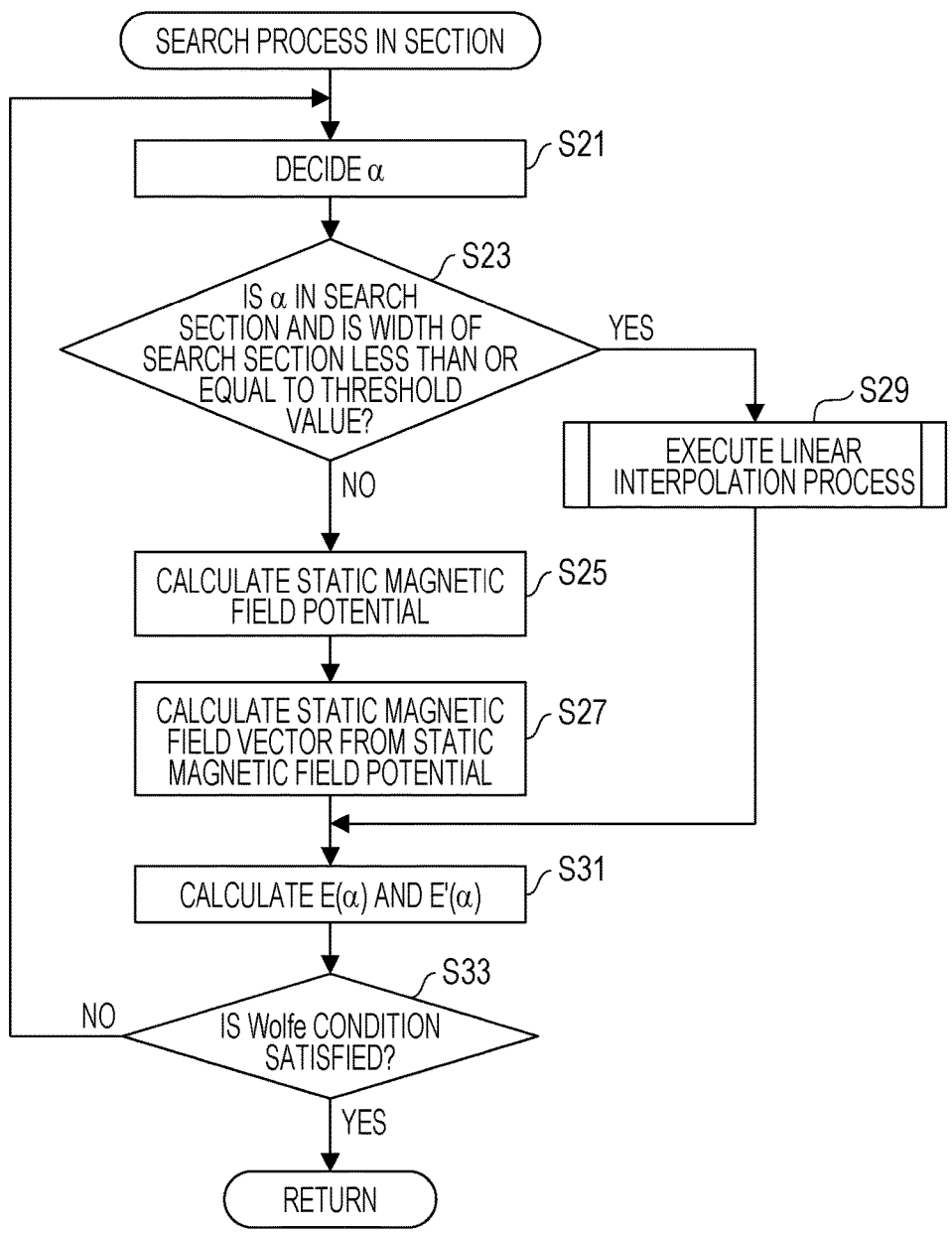
FIG. 7 is a diagram illustrating a processing flow of a search process in the section.

First, the search unit 1033 of the line search unit 103 decides $\alpha$ (FIG. 7: Step S21), and stores the value of the decided $\alpha$ in the rotational coefficient storage unit 1034. In Step S21, for example, $\alpha$ is decided by a bisection method, a secant method, or the like.

The search unit 1033 determines whether or not a condition is satisfied in which $\alpha$ is in the search section and the width of the search section decided in Step S11 is less than or equal to a threshold value based on the information of the search section stored in the section data storage unit 1032 (Step S23).

In a case where the condition is not satisfied in which $\alpha$ is in the search section and the width of the search section decided in Step S11 is less than or equal to a threshold value (NO in Step S23), the search unit 1033 instructs the calculation unit 1035 to execute a process. According to this, the potential calculation unit 10351 calculates a static magnetic field potential of each element i according to Expression (7) based on the value of $\alpha$ stored in the rotational coefficient storage unit 1034 and the data, such the data of the magnetization vector, or the like, stored in the input data storage unit 101 (Step S25). Then, the first vector calculation unit 10352 calculates a static magnetic field vector of each element i from the static magnetic field potential of each element i according to Expression (6) based on the processing result of Step S25 (Step S27). The first vector calculation unit 10352 stores the data of the static magnetic field vector which is the processing result of Step S27 in the vector data storage unit 1037.

In contrast, in a case where the condition is satisfied in which $\alpha$ is in the search section and the width of the search section decided in Step S11 is less than or equal to a threshold value (Step S23: Yes Route), the search section process instructs the second vector calculation unit 1036 to execute a linear interpolation process. According to this, the second vector calculation unit 1036 executes the linear interpolation process (Step S29). The linear interpolation process will be described by using FIG. 9.

The linear interpolation process is a process of obtaining a static magnetic field vector according to the following expression without using a static magnetic field potential.

$$H_{static}(\alpha) = \frac{1}{\alpha_{END} - \alpha_{STA}} \{(H_{static(\alpha_{END})} - H_{static(\alpha_{STA})})\alpha + (\alpha_{END} H_{static(\alpha_{STA})} - \alpha_{STA} H_{static(\alpha_{END})})\} \quad (8)$$

Here, $\alpha_{STA}$ indicates the magnetization vector rotational coefficient $\alpha$ at the start point or the left end of the search section, and $\alpha_{END}$ indicates the magnetization vector rotational coefficient $\alpha$ at the end point or the right end of the search section. In a case where the search section is large, the accuracy of the interpolation decreases. Accordingly, the interpolation is performed only in a case where a $|\alpha_{STA} - \alpha_{END}|$ is less than or equal to a threshold value. For example, in the program, in a case where the number of elements of the model is N, a static magnetic field vector $H_{static}$ is three N-dimensional arrays with respect to an X axis component, a Y axis component, and a Z axis component of each element. $\alpha$, $\alpha_{STA}$, and $\alpha_{END}$ are scalar variables, respectively. It is considered that in a case where the amount of change in the magnetization vector of each element is small, the amount of change in the static magnetic field vector is also small, and thus, the calculation using the expression (8) is able to be applied.

Figure 9:
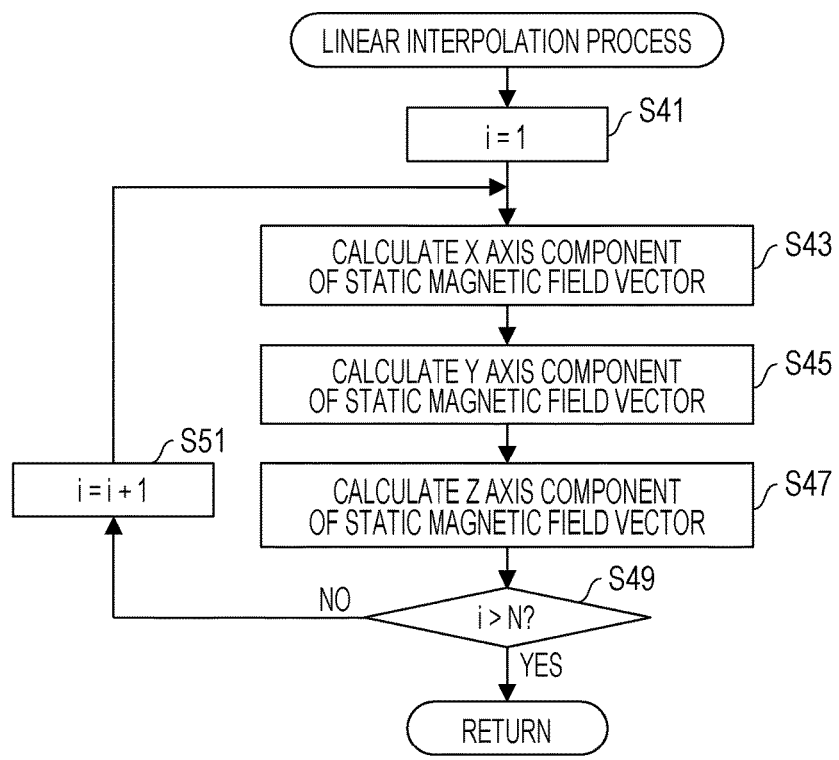
FIG. 9 is a diagram illustrating a processing flow of a linear interpolation process.

First, the second vector calculation unit 1036 sets a variable i indicating the element to be i=1 (Step S41 in FIG. 9).

The second vector calculation unit 1036 calculates the X axis component of the static magnetic field vector based on the value of $\alpha$ stored in the rotational coefficient storage unit 1034, the information of the search section stored in the section data storage unit 1032, and the like (Step S43). In Step S43, the X axis component of the static magnetic field vector is calculated by the following expression.

$$H_{x,i} = \frac{1}{\alpha_{END} - \alpha_{STA}} \{(H_{x,i}^{END} - H_{x,i}^{STA})\alpha + (\alpha_{END} H_{x,i}^{STA} - \alpha_{STA} H_{x,i}^{END})\} \quad (9)$$

Here, the X axis component of the static magnetic field vector at each of the ends of the search section is calculated in advance by using the static magnetic field potential before the process of Step S43.

The second vector calculation unit 1036 calculates the Y axis component of the static magnetic field vector based on the value of $\alpha$ stored in the rotational coefficient storage unit 1034, the information of the search section stored in the section data storage unit 1032, and the like (Step S45). In Step S45, the Y axis component of the static magnetic field vector is calculated by the following expression.

$$H_{y,i} = \frac{1}{\alpha_{END} - \alpha_{STA}} \{(H_{y,i}^{END} - H_{y,i}^{STA})\alpha + (\alpha_{END} H_{y,i}^{STA} - \alpha_{STA} H_{y,i}^{END})\} \quad (10)$$

Here, the Y axis component of the static magnetic field vector at each of the ends of the search section is calculated in advance from the static magnetic field potential before the process of Step S45.

The second vector calculation unit 1036 calculates the Z axis component of the static magnetic field vector based on the value of $\alpha$ stored in the rotational coefficient storage unit 1034, the information of the search section stored in the section data storage unit 1032, and the like (Step S47). In Step S47, the Z axis component of the static magnetic field vector is calculated by the following expression.

$$H_{z,i} = \frac{1}{\alpha_{END} - \alpha_{STA}} \{(H_{z,i}^{END} - H_{z,i}^{STA})\alpha + (\alpha_{END} H_{z,i}^{STA} - \alpha_{STA} H_{z,i}^{END})\} \quad (11)$$

Here, the Z axis component of the static magnetic field vector at each of the both ends of the search section is calculated in advance from the static magnetic field potential before the process of Step S47.

The second vector calculation unit 1036 determines whether or not i>N is established (Step S49). In a case where i>N is not established (NO in Step S49), the second vector calculation unit 1036 increases i by 1 (Step S51). Then, the procedure returns to the process of Step S43. In contrast, in a case where i>N is established (YES in Step S49), the second vector calculation unit 1036 stores the data of the calculated static magnetic field vector in the vector data storage unit 1037. Then, the procedure returns to the process before being called.

Returning to the description of FIG. 7, the determination unit 1038 calculates E(α) and E'(α) by using Expressions (1) to (5) based on the data of the static magnetic field vector stored in the vector data storage unit 1037 and the data stored in the input data storage unit 101 (Step S31).

The determination unit 1038 determines whether or not a Wolfe condition is satisfied (Step S33). The Wolfe condition is the following condition.

$$\text{Wolfe condition:} \begin{cases} E(\alpha) - E(0) \le \delta \alpha E'(0) \\ E'(\alpha) \ge \sigma E'(0) \\ 0 < \delta \le \sigma < 1 \end{cases} \quad (12)$$

Accordingly, it is not always possible that the magnetic energy $E_{total}(\alpha)$ is strictly minimized, that is, $dE_{total}/d\alpha$. In the Wolfe condition, δ is a parameter determining the upper limit of α satisfying the Wolfe condition, and σ is a parameter determining the lower limit of α satisfying the Wolfe condition.

In a case where the Wolfe condition is not satisfied (NO in Step S33), the procedure returns to the process of Step S21 in order to process the next α. In contrast, in a case where the Wolfe condition is satisfied (YES in Step S33), the procedure returns to the process before being called.

By executing a process described above, each magnetization vector is able to be rotated by using the magnetization vector rotational coefficient α which minimizes the magnetic energy $E_{total}(\alpha)$. Furthermore, the magnetization vector rotational coefficient α is in common for the entire element, and thus, the magnetic energy $E_{total}(\alpha)$ is a function of the magnetization vector rotational coefficient α as one variable Returning to the description of FIG. 4, the processing unit 102 rotates the magnetization vector of each element i around a rotation axis $V_i = d_i \times m_i$ by an angle of rotation $|\alpha d_i|$ according to the right-hand rule (Step S7).

The processing unit 102 determines whether or not a residual error of the magnetization vector is less than or equal to a predetermined value (Step S9). The residual error in Step S9, for example, is the average value, the maximum value, or the like of the absolute value of the differential vector between the magnetization vector before rotation and the magnetization vector after rotation. In a case the residual error of the magnetization vector is not less than or equal to a predetermined value (NO in Step S9), the processing unit 102 updates the data of the magnetization vector stored in the input data storage unit 101 according to the data of the magnetization vector after rotation. Then, the procedure returns to the process of Step S1. In contrast, in a case where the residual error of the magnetization vector is less than or equal to a predetermined value (Step S9: Yes Route), the processing unit 102 stores the data of the magnetization vector after rotation in the output data storage unit 104. Then, the process ends.

As described above, in a case where the process of obtaining the static magnetic field vector is executed by the interpolation, it is possible to omit a part of a process of solving a linear simultaneous equation which is executed at the time of obtaining the static magnetic field vector from the static magnetic field potential. Accordingly, the calculation amount is able to be reduced, and a time desired until the simulation is completed is able to be shortened.

Shortening a time desired for the micro-magnetic simulation will be described by using FIG. 10 and FIG. 11. Here, it is considered the case in which calculation for obtaining a hysteresis curve of the magnetic body is performed.

Figures 10, 11:
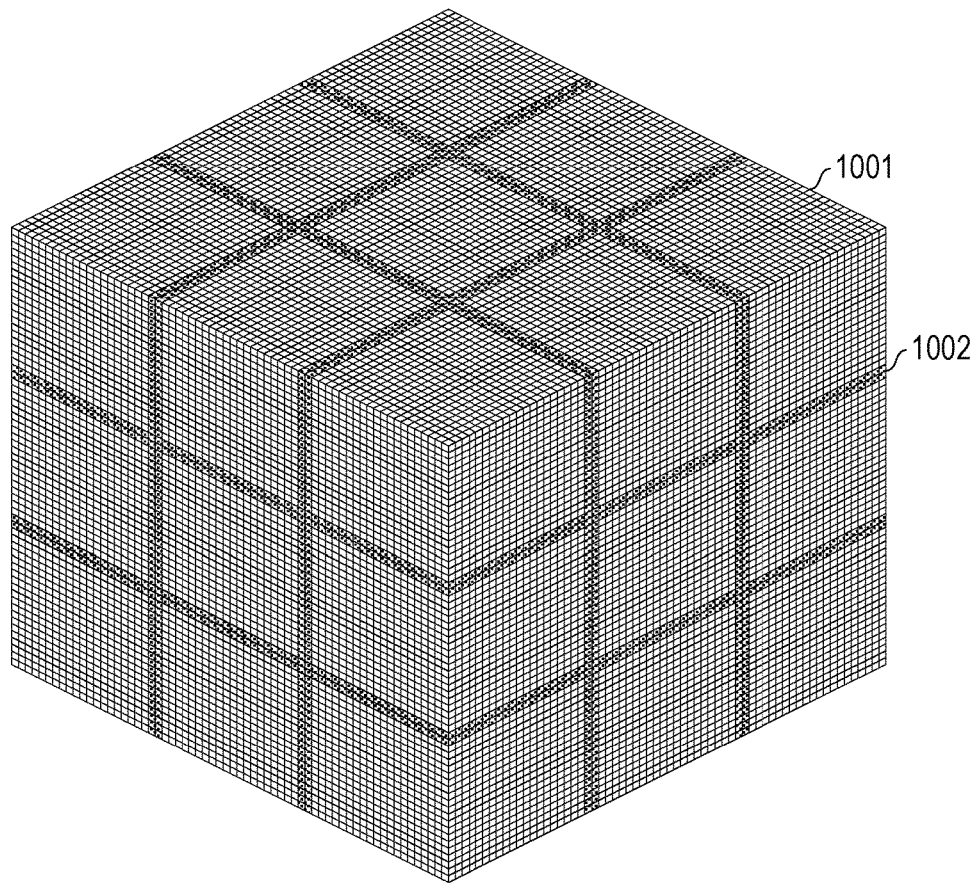
FIG. 10 is a diagram for illustrating shortening of a time desired for a micro-magnetic simulation.
FIG. 11 is a diagram for illustrating the shortening of the time desired for the micro-magnetic simulation.

FIG. 10 illustrates the details of the model. The model includes a main layer 1001 and a grain boundary layer 1002. Physical property values of the main layer 1001 are $M_s$=1.61 [T], A=1.25*10$^{-11}$ [J/m], and $H_k$=5.59*10$^6$ [A/m]. Physical property values of the grain boundary layer 1002 are $M_s$=0.5 [T], A=6.0*10$^{-12}$ [J/m], and $H_k$=0.0 [A/m]. Here, $M_s$ indicates saturation magnetization, A indicates an exchange coupling constant, and $H_k$ indicates an anisotropic magnetic field.

FIG. 11 illustrates a magnetic coercive force calculated by hysteresis calculation, the number of times of performing calculation of the static magnetic field potential in a calculation process, and a calculation time. In FIG. 11, results of a case in which the calculation is executed by the method of this embodiment and a case in which the calculation is executed without using the method of this embodiment are illustrated. In a case where the magnetic coercive forces are the same value, it is considered that the accuracies of the calculation are the same degree, and thus, it is possible to shorten the calculation time by approximately 0.6 times while maintaining the accuracy of the calculation by using the method of this embodiment. Accordingly, by using the method of this embodiment, it is possible to execute the micro-magnetic simulation of a larger model in the same calculator.

Figure 12:
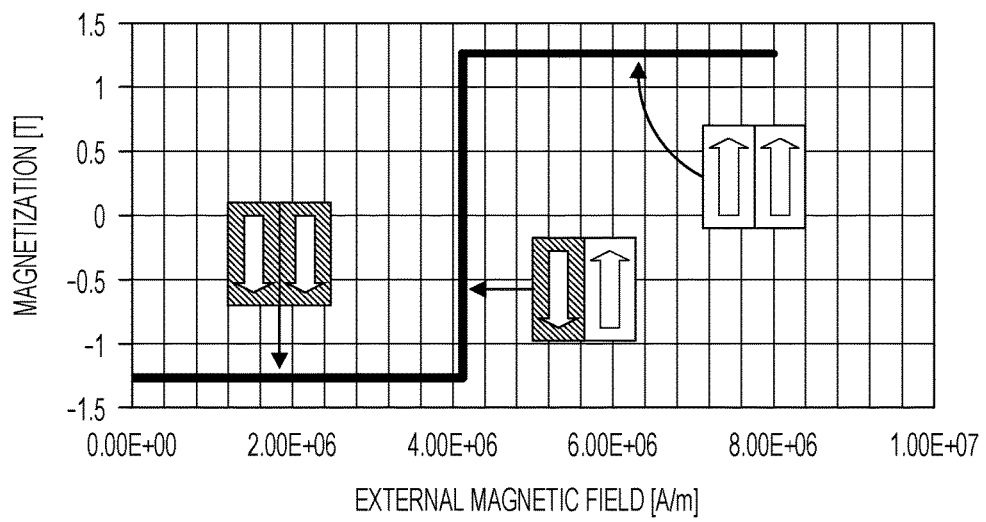
FIG. 12 is a diagram illustrating one example of an M-H curve.

FIG. 12 illustrates an M-H curve. In FIG. 12, a vertical axis indicates magnetization in T, and a horizontal axis indicates an external magnetic field in A/m. In FIG. 12, an aspect is illustrated in which in a case where the external magnetic field applied to a magnet becomes gradually stronger, the magnetization of the magnet reverses in a certain external magnetic field. By repeatedly executing the micro-magnetic simulation of this embodiment while changing external magnetization, it is possible to find properties as illustrated in FIG. 12.

One embodiment of the embodiment has been described, but the embodiment is not limited thereto. For example, there is a case where a functional block configuration of the information processing device 1 described above is not coincident with an actual program module configuration.

In addition, in the processing flow, the order of the process is able to be changed insofar as the processing result is not changed. Further, the processes may be executed in parallel.

Figure 13:
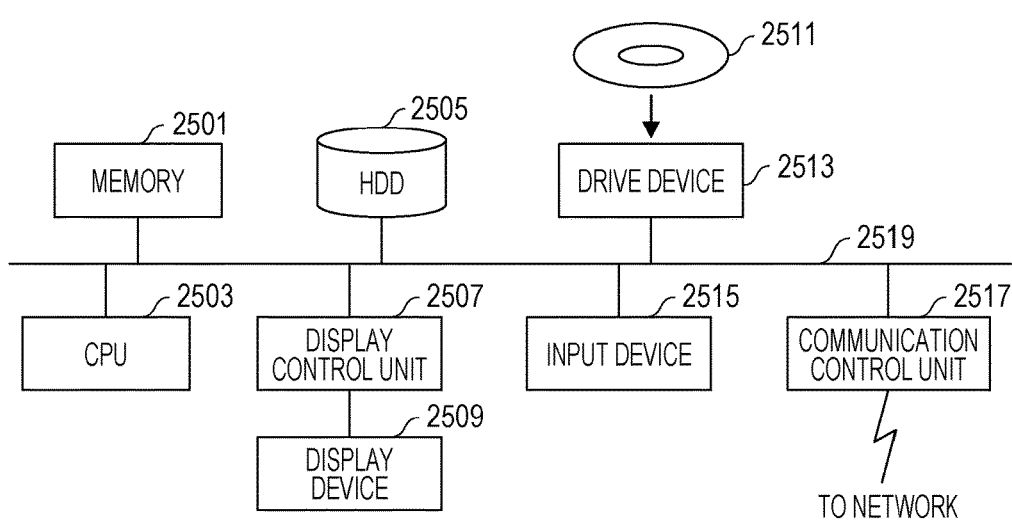
FIG. 13 is a functional block diagram of a computer.

Furthermore, the information processing device 1 described above is a computer device, and as illustrated in FIG. 13, a memory 2501, a central process unit (CPU) 2503 such as a processor, a hard disk drive (HDD) 2505, a display control unit 2507 to be connected to a display device 2509, a drive device 2513 for a removable disk 2511, an input device 2515, and a communication control unit 2517 for being connected to a network are connected to each other through a bus 2519. An operating system (OS), and an application and a program for executing the process of this example are stored in the HDD 2505, and are read out from the HDD 2505 to the memory 2501 at the time of being executed by the CPU 2503. The CPU 2503 controls the display control unit 2507, the communication control unit 2517, and the drive device 2513 according to the processing contents of the application and the program, and performs a predetermined operation. In addition, data in processing is mainly stored in the memory 2501, and may be stored in the HDD 2505. In an example of the embodiment, the application and the program for executing the process described above are stored and distributed in the computer readable removable disk 2511, and are installed in the HDD 2505 from the drive device 2513. There is a case where the application and the program are installed in the HDD 2505 through a network such as the internet and the communication control unit 2517. Such a computer device realizes various functions as described above by organically cooperating with hardware such as the CPU 2503 and the memory 2501 described above, OS, and a program such as the application and the program.

The summary of embodiments of the embodiment is as follows.

A magnetic body simulation device according to a first aspect of this embodiment includes, (A) a decision unit which decides a search section of a rotational coefficient of a magnetization vector in process of calculating each rotational coefficient of a plurality of elements in process of calculating each magnetization vector of the plurality of elements in a state in which magnetic energy of a magnetic body including the plurality of elements is minimized, (B) a first determination unit which determines whether or not a first condition is satisfied in which a width of the search section decided by the decision unit is less than or equal to a predetermined length, and a first rotational coefficient decided by a predetermined method is included in the search section, and (C) a first calculation unit which calculates a static magnetic field vector corresponding to the first rotational coefficient by linear interpolation based on a static magnetic field vector with respect to both ends of the search section in a case in which the first determination unit determines that the first condition is satisfied.

Accordingly, it does not have to obtain the static magnetic field vector from the static magnetic field potential, and thus, it is possible to reduce the calculation amount of the micromagnetic simulation.

In addition, the magnetic body simulation device described above may further include, (D) a second calculation unit which calculates the magnetic energy of the magnetic body based on the static magnetic field vector calculated by the first calculation unit, and (E) a second determination unit which determines whether or not the magnetic energy which is calculated by the second calculation unit satisfies a second condition with respect to a magnitude of the magnetic energy, and outputs the first rotational coefficient in a case in which the magnetic energy satisfies the second condition.

Accordingly, it is possible to execute a post-process in the NCG method by using the first rotational coefficient in a case where the calculated magnetic energy satisfies the second condition.

In addition, the magnetic body simulation device described above may further include, (F) third calculation unit which calculates a static magnetic field vector corresponding to the first rotational coefficient according to a static magnetic field potential calculated based on each magnetization vector of the plurality of elements in a case in which the first determination unit determines that the first condition is not satisfied. Accordingly, in a case where it is not suitable that the static magnetic field vector is calculated by the linear interpolation (that is, the accuracy of the interpolation decreases), it is possible to calculate the static magnetic field vector by a normal method.

In addition, the first calculation unit described above may calculate (c1) the static magnetic field vector corresponding to the first rotational coefficient by dividing a sum of a first vector which is a vector in which a vector obtained by subtracting a static magnetic field vector with respect to an end point of the search section from a static magnetic field vector with respect to a start point of the search section is multiplied by the first rotational coefficient, and a second vector which is a vector in which a vector obtained by multiplying the static magnetic field vector with respect to the end point of the search section by the rotational coefficient with respect to the start point of the search section is subtracted from a vector obtained by multiplying the static magnetic field vector with respect to the start point of the search section by the rotational coefficient with respect to the end point of the search section, by a value obtained by subtracting the rotational coefficient with respect to the start point of the search section from the rotational coefficient with respect to the end point of the search section.

In addition, the predetermined method described above may be a bisection method and a secant method.

A micro-magnetization calculation method according to a second aspect of this embodiment includes, (G) a process of deciding a search section of a rotational coefficient of a magnetization vector in process of calculating each rotational coefficient of a plurality of elements in process of calculating each magnetization vector of the plurality of elements in a state in which magnetic energy of a magnetic body including the plurality of elements is minimized, (H) a process of determining whether or not a first condition is satisfied in which a width of the search section decided by the decision unit is less than or equal to a predetermined length, and a first rotational coefficient decided by a predetermined method is included in the search section, and (I) a process of calculating a static magnetic field vector corresponding to the first rotational coefficient by linear interpolation based on a static magnetic field vector with respect to both ends of the search section in a case in which the first determination unit determines that the first condition is satisfied.

Furthermore, it is possible to prepare a program for allowing a computer or a processor to execute the process of the method described above, and the program, for example, is stored in a computer readable storage medium or a storage device such as a flexible disk, CD-ROM, a magnetooptical disk, a semiconductor memory, and a hard disk. Furthermore, an intermediate processing result is temporarily retained in a storage device such as a main memory.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A magnetic body simulation device comprising:
a memory; and
a processor coupled to the memory and the processor configured to,
decide a search section for searching a minimum rotational coefficient of magnetization vectors in which magnetic energy of a magnetic body including a plurality of elements which is obtained by dividing the magnetic body is minimized based on magnetization vectors of the plurality of elements,
determine a rotational coefficient candidate by a bisection method or a secant method,
determine whether or not a width of the search section is less than or equal to a threshold value, and the rotational coefficient candidate is included in the search section,
calculate, when determining that the width is less than or equal to the threshold value and the rotational coefficient candidate is included in the search section, a static magnetic field vector corresponding to the rotational coefficient candidate by linear interpolation based on static magnetic field vectors at both ends of the search section,
calculate, based on the static magnetic field vector, the magnetic energy of the magnetic body corresponding to the rotational coefficient candidate and a differential value of the magnetic energy, and
determine whether or not the calculated magnetic energy and the calculated differential value of the magnetic energy satisfy a Wolfe condition regarding a rotational coefficient, and
set the rotational coefficient candidate as the minimum rotational coefficient when the calculated magnetic energy and the calculated differential value of the magnetic energy satisfy the Wolfe condition regarding the rotational coefficient.

2. The magnetic body simulation device according to claim 1, wherein the processor is configured to calculate the calculated static magnetic field vector based on the magnetization vectors of the plurality of elements when determining that the width is larger than the threshold value or the rotational coefficient candidate is not included in the search section.

3. The magnetic body simulation device according to claim 2, wherein the processor is configured to calculate the static magnetic field vector by using a static magnetic field potential calculated based on each magnetization vector of the plurality of elements.

4. The magnetic body simulation device according to claim 1, wherein:
the linear interpolation is performed by dividing a sum of a first vector and a second vector by a value which is obtained by subtracting a start rotational coefficient with respect to a start point of the search section from an end rotational coefficient with respect to an end point of the search section,
the first vector is a vector which is obtained by multiplying the rotational coefficient candidate by a vector obtained by subtracting an end static magnetic field vector with respect to the end point of the search section from a start static magnetic field vector with respect to the start point of the search section,
the second vector is a vector which is obtained by subtracting a third vector from a fourth vector,
the third vector is obtained by multiplying the end static magnetic field vector by the start rotational coefficient, and
the fourth vector is obtained by multiplying the start static magnetic field vector by the end rotational coefficient.

5. The magnetic body simulation device according to claim 1, wherein the Wolfe condition regarding the rotational coefficient is expressed by the following expression:

$$E(\alpha) - E(0) \leq \delta \alpha E'(\alpha)$$

$$E(\alpha) \geq \sigma E'(\alpha)$$

$$0 < \delta \leq \sigma < 1,$$

where $\alpha$ is the rotational coefficient candidate, $\delta$ is a parameter which determines an upper limit of $\alpha$ satisfying the Wolfe condition, and $\sigma$ is a parameter which determines a lower limit of $\alpha$ satisfying the Wolfe condition.

6. A micro-magnetization calculation method comprising:
deciding, by a processor, a search section for searching a minimum rotational coefficient of magnetization vectors in which magnetic energy of a magnetic body including a plurality of elements which is obtained by dividing the magnetic body is minimized based on magnetization vectors of the plurality of elements;
determining a rotational coefficient candidate by a bisection method or a secant method;
determining whether or not a width of the decided search section is less than or equal to a threshold value, and the rotational coefficient candidate is included in the search section;
calculating, when determining that the width is less than or equal to the threshold value and the rotational coefficient candidate is included in the search section, a static magnetic field vector corresponding to the rotational coefficient candidate by linear interpolation based on static magnetic field vectors at both ends of the search section,
calculating, based on the static magnetic field vector, the magnetic energy of the magnetic body corresponding to the rotational coefficient candidate and a differential value of the magnetic energy, and
determining whether or not the calculated magnetic energy and the calculated differential value of the magnetic energy satisfy a Wolfe condition regarding a rotational coefficient, and
setting the rotational coefficient candidate as the minimum rotational coefficient when the calculated magnetic energy and the calculated differential value of the magnetic energy satisfy the Wolfe condition regarding the rotational coefficient.

7. The micro-magnetization calculation method according to claim 6, further comprising:
calculating the calculated static magnetic field vector based on the magnetization vectors of the plurality of elements when determining that the width is larger than the threshold value or the rotational coefficient candidate is not included in the search section.

8. The micro-magnetization calculation method according to claim 6, wherein the static magnetic field vector is calculated by using a static magnetic field potential calculated based on each magnetization vector of the plurality of elements.

9. The micro-magnetization calculation method according to claim 6, wherein:
the linear interpolation is performed by dividing a sum of a first vector and a second vector by a value which is obtained by subtracting a start rotational coefficient with respect to a start point of the search section from an end rotational coefficient with respect to an end point of the search section,
the first vector is a vector which is obtained by multiplying the rotational coefficient candidate by a vector obtained by subtracting an end static magnetic field vector with respect to the end point of the search section from a start static magnetic field vector with respect to the start point of the search section,
the second vector is a vector which is obtained by subtracting a third vector from a fourth vector,
the third vector is obtained by multiplying the end static magnetic field vector by the start rotational coefficient, and
the fourth vector is obtained by multiplying the start static magnetic field vector by the end rotational coefficient.

10. The micro-magnetization calculation method according to claim 6, wherein the Wolfe condition regarding the rotational coefficient is expressed by the following expression:

$$E(\alpha)-E(0) \leq \delta\alpha E'(\alpha)$$

$$E(\alpha) \geq \sigma E'(\alpha)$$

$$0 < \delta \leq \sigma < 1,$$

where $\alpha$ is the rotational coefficient candidate, $\delta$ is a parameter which determines an upper limit of $\alpha$ satisfying the Wolfe condition, and $\sigma$ is a parameter which determines a lower limit of $\alpha$ satisfying the Wolfe condition.

11. A non-transitory computer-readable recording medium having stored therein a program for causing a computer to execute a process for a simulation of a magnetic body, the process comprising:
deciding a search section for searching a minimum rotational coefficient of magnetization vectors in which magnetic energy of a magnetic body including a plurality of elements which is obtained by dividing the magnetic body is minimized based on magnetization vectors of the plurality of elements;
determining a rotational coefficient candidate by a bisection method or a secant method,
determining whether or not a width of the search section is less than or equal to a threshold value, and the rotational coefficient candidate is included in the search section;
calculating, when determining that the width is less than or equal to the threshold value and the rotational coefficient candidate is included in the search section, a static magnetic field vector corresponding to the rotational coefficient candidate by linear interpolation based on static magnetic field vectors at both ends of the search section,
calculating, based on the static magnetic field vector, the magnetic energy of the magnetic body corresponding to the rotational coefficient candidate and a differential value of the magnetic energy, and
determining whether or not the calculated magnetic energy and the calculated differential value of the magnetic energy satisfy a Wolfe condition regarding a rotational coefficient, and
setting the rotational coefficient candidate as the minimum rotational coefficient when the calculated magnetic energy and the calculated differential value of the magnetic energy satisfy the Wolfe condition regarding the rotational coefficient.

12. The non-transitory computer-readable recording medium according to claim 11, further comprising:
calculating the calculated static magnetic field vector based on the magnetization vectors of the plurality of elements when determining that the width is larger than the threshold value or the rotational coefficient candidate is not included in the search section.

13. The non-transitory computer-readable recording medium according to claim 12, wherein the static magnetic field vector is calculated by using a static magnetic field potential calculated based on each magnetization vector of the plurality of elements.

14. The non-transitory computer-readable recording medium according to claim 11, wherein:
the linear interpolation is performed by dividing a sum of a first vector and a second vector by a value which is obtained by subtracting a start rotational coefficient with respect to a start point of the search section from an end rotational coefficient with respect to an end point of the search section,
the first vector is a vector which is obtained by multiplying the rotational coefficient candidate by a vector obtained by subtracting an end static magnetic field vector with respect to the end point of the search section from a start static magnetic field vector with respect to the start point of the search section,
the second vector is a vector which is obtained by subtracting a third vector from a fourth vector,
the third vector is obtained by multiplying the end static magnetic field vector by the start rotational coefficient, and
the fourth vector is obtained by multiplying the start static magnetic field vector by the end rotational coefficient.

15. The non-transitory computer-readable recording medium according to claim 11, wherein the Wolfe condition regarding the rotational coefficient is expressed by the following expression:

$$E(\alpha)-E(0) \leq \delta\alpha E'(\alpha)$$

$$E(\alpha) \geq \sigma E'(\alpha)$$

$$0 < \delta \leq \sigma < 1,$$

where $\alpha$ is the rotational coefficient candidate, $\delta$ is a parameter which determines an upper limit of $\alpha$ satisfying the Wolfe condition, and $\sigma$ is a parameter which determines a lower limit of $\alpha$ satisfying the Wolfe condition.

* * * * *